United States Patent
Roessig, III et al.

(10) Patent No.: US 7,227,385 B2
(45) Date of Patent: Jun. 5, 2007

(54) ACTUATION CIRCUIT FOR MEMS STRUCTURES

(75) Inventors: Trey Allen W. Roessig, III, Fremont, CA (US); Mark A. Lemkin, Albany, CA (US); William A. Clark, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 72 days.

(21) Appl. No.: 10/738,375

(22) Filed: Dec. 17, 2003

(65) Prior Publication Data

US 2005/0134320 A1 Jun. 23, 2005

(51) Int. Cl.
*H03K 3/00* (2006.01)
*H03K 19/094* (2006.01)
(52) U.S. Cl. .................. 326/136; 326/83; 327/112
(58) Field of Classification Search ............... 326/136; 327/328, 319, 108, 112, 320
See application file for complete search history.

(56) References Cited

U.S. PATENT DOCUMENTS

| 4,247,791 A * | 1/1981 | Rovell .................... 327/52 |
| 5,859,548 A * | 1/1999 | Kong ..................... 326/113 |
| 6,700,719 B2 * | 3/2004 | Iroaga et al. ............ 360/46 |
| 2002/0191315 A1 * | 12/2002 | Iroaga et al. ............ 360/46 |

* cited by examiner

*Primary Examiner*—Daniel Chang
(74) *Attorney, Agent, or Firm*—Vierra Magen Marcus & DeNiro LLP

(57) ABSTRACT

An actuation circuit which actuates force electrodes using an open loop transconductance stage. The actuation circuit includes at least a first output and a second output, and a first input. The circuit includes a current sink coupled to the first output which is enabled when a current is applied to said first input. The circuit also includes a decision switch which is coupled to the current sink and which enables a current path from the first input to the second output when a voltage present at said first output reaches a predetermined minimum level.

27 Claims, 8 Drawing Sheets

ACTUATION CIRCUIT FOR MEMS STRUCTURES

BACKGROUND OF THE INVENTION

1. Field of the Invention

The invention is directed towards a method and apparatus for controlling the output current of a multiple output transconductance system, and in particular to a method and apparatus for controlling a microelectromechanical system (MEMS) device such as a steerable mirror.

2. Description of the Related Art

MEMs devices and systems have proven useful in numerous sensing and actuating applications. Illustrative applications for MEMS devices include optical switches, inertial or pressure sensors, and biomedical devices. MEMS devices can also be used in a switching capacity in the telecommunication industry, particularly in optical telecommunication systems.

In optical telecommunication systems, MEMS devices are called on to switch the path of the transmitted light, sometimes referred to as beam steering. In beam steering, the light from the fiber is selectively deflected or steered by one or more movable optical element from an input fiber to an output fiber. Suitable optical elements for performing this task include (MEMS) mirrors.

MEMS may be fabricated on semiconductor substrates, typically silicon substrates. These microelectromechanical systems typically have sizes on the order of microns and may be integrated with other electrical circuits on a common substrate. Present MEMS-based optical switches can operate in the plane of the substrate or normal to the substrate. Because each fiber in an optical telecommunication system has a small "acceptance window", some degree of accuracy is required in positioning the mirror to direct the transmitted light to the output fiber.

The actuation force used to move MEMS mirrors in an optical cross-connect system is typically electrostatic, electromagnetic, piezoelectric or thermal. As part of the mirror control system, a feedback circuit is generally used to monitor the position of the mirror. In electrostatically actuated mirror applications, generally high voltages (on the order of 80–200 volts) may be required to position the mirror. Typically, however, dealing with such high voltages in the design of multiple mirror systems (having, for example, hundreds or thousands of mirrors on a single application) presents a number of difficulties. Although the high voltages are required to position the mirror, designers generally desire to use lower voltages to control the mirrors and other aspects of the circuits in the mirror array to save heat and power.

FIG. 1 illustrates a generalized block level diagram of a prior art configuration for positioning a MEMS mirror 100 using capacitive electrostatic coupling. Two control pads 102, 104 are positioned relative to a mirror surface 100. The mirror 100 may be fabricated in accordance with any of a number of well known MEMS fabrication techniques out of a semiconductor material which is polished and positioned in accordance with well known techniques as reflected in: "Embedded interconnect and electrical isolation for high-aspect-ratio, SOI inertial instruments", Brosnihan, T. J.; Bustillo, J. M.; Pisano, A. P.; Howe, R. T., Solid State Sensors and Actuators, 1997. TRANSDUCERS '97 Chicago, 1997 International Conference, Volume: 1, 1997; "Single-chip surface-micromachined integrated gyroscope with 50/spl deg//hour root allan variance", Geen, J. A.; Sherman, S. J.; Chang, J. F.; Lewis, S. R., Solid-State Circuits Conference, 2002. Digest of Technical Papers. 2002 IEEE International, Volume: 2, 2002, Page(s): 346–539. A voltage between the force pad 102, 104 and the mirror 100 generates an electrostatic force to move the mirror relative to the pad. While only two pads 102, 104 are illustrated, many systems use four or more pads for true three dimensional movement.

The mirror is positioned relative to the substrate and pads 102, 104 using voltage generated by an amplifier 110 coupled to control pads adjacent to the mirror to be controlled. In FIG. 1, a high voltage amplifier 110 (generally on the order of 80–200 v) such as that described in co-pending U.S. patent application Ser. No. 09/944,930 entitled "High Voltage Integrated Current Amplifier", by inventor Mark Lemkin, commonly assigned, is used to generate voltages sufficient to provide electrostatic actuation between the control pads 102, 104 and the mirror 100. A low voltage transconductance circuit may be optionally provided in place of the amplifier to convert the voltage to a current to drive the control pads.

As noted above, in optical switching applications, one needs to understand the position of the mirror. In order to determine the position of the mirror, a common technique is to provide a position sense channel 120 coupled to the mirror. Generally, the sense channel 120 detects the voltage present at the interface between the mirror and the control pad, and through a series of measurements, position of the mirror is determined.

Normally the sense channel 120 will be designed using low voltage components which results in a number of integration issues with the high voltage devices used to position the mirror. Any position sense channel design must deal with the fundamental issues of providing feedback from the output of the system (a high voltage amplifier output) without using a DC current or a high voltage switch. Use of a DC current feedback system is impractical in high density switch applications as too much power would be required on the circuit. High voltage switches are generally costly in terms of the amount of size required to implement them.

SUMMARY OF THE INVENTION

The present invention pertains to operation of capacitive circuits, and in particular, capacitive circuits formed by MEMS devices used in optical mirror arrays. The invention provides a novel solution to the problem of high voltage actuation of MEMS structure such as optical mirrors. In a first embodiment, the invention includes an actuation circuit which actuates force electrodes using an open loop transconductance stage. This aspect provides a solution to the problem of feedback from a high voltage amplifier by using an open loop transconductance stage or actuation circuit.

In one embodiment, the invention comprises an actuation circuit having at least a first output and a second output, and a first input. The circuit includes a current sink coupled to the first output which is enabled when a current is applied to said first input. The circuit also includes a decision switch which is coupled to the current sink and which enables a current path from the first input to the second output when a voltage present at said first output reaches a predetermined minimum level.

In a further unique aspect of the invention, the decision switch may comprise a diode or a transistor. A gain element may be connected to the input and a current mirror coupled to the decision switch to couple the input current to the first output.

In another embodiment, the actuation circuit further includes a second current sink enabled responsive to a voltage at the second output.

In an alternative embodiment, the invention comprises an apparatus. The apparatus comprises a micromechanical mirror structure positioned adjacent to a first and a second force pads, and a control circuit having a first output coupled to the first control pad and a second output coupled to the second control pad. In this embodiment, the control circuit includes an input having a current coupled thereto; a decision transistor coupled to the first output and enabling a current path to the second output; and a current sink coupled to the first output.

In yet anther embodiment, the invention may comprise a method of operating a micromachined mirror having at least a first force pad coupled to a first control output and a second force pad coupled to a second control output, both force pads provided adjacent to the mirror. The method may include the steps of: receiving a control current designated for the first output; detecting whether an output voltage is present at said second output; sinking current second output to ground; and steering the control current provided to said first output when said output voltage is below a threshold.

In a further aspect, the method step of detecting comprises coupling a gate of a decision transistor to a conduction path of said fist output, and said step of steering comprises activating said transistor when said output voltage reflected at said first output reaches said threshold.

In yet another aspect, the method step of step of sinking comprises sinking current responsive to said control current.

In still another aspect, the method step of sinking comprises sinking current responsive to an output voltage present at said first output.

In a further embodiment, the invention comprises a steerable micromachined mirror assembly. The assembly may include a micromachined mirror positioned adjacent to at least a first force pad and a second force pad, a high voltage amplifier, and a low voltage transconductance stage. The assembly may further include a control circuit coupled to said first force pad and said second force pad. The control circuit may include a current sink coupled to the first force pad, the current sink enabled when a current from said transconductance stage is received; and a decision switch coupled to the current sink and enabling a current path from the transconductance stage to the second output when a voltage present at said first output reaches a predetermined minimum level.

These and other objects and advantages of the present invention will appear more clearly from the following description in which a detailed embodiment of the invention has been set forth in conjunction with the drawings.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

The invention provides a novel solution to high voltage actuation of MEMS structures, notably mirrors. In general, the invention will be described with respect to a two dimensional embodiment of a mirror and force pad. However, it will be generally understood that the principles may be applied to systems using more than two force pads.

Figure 1:
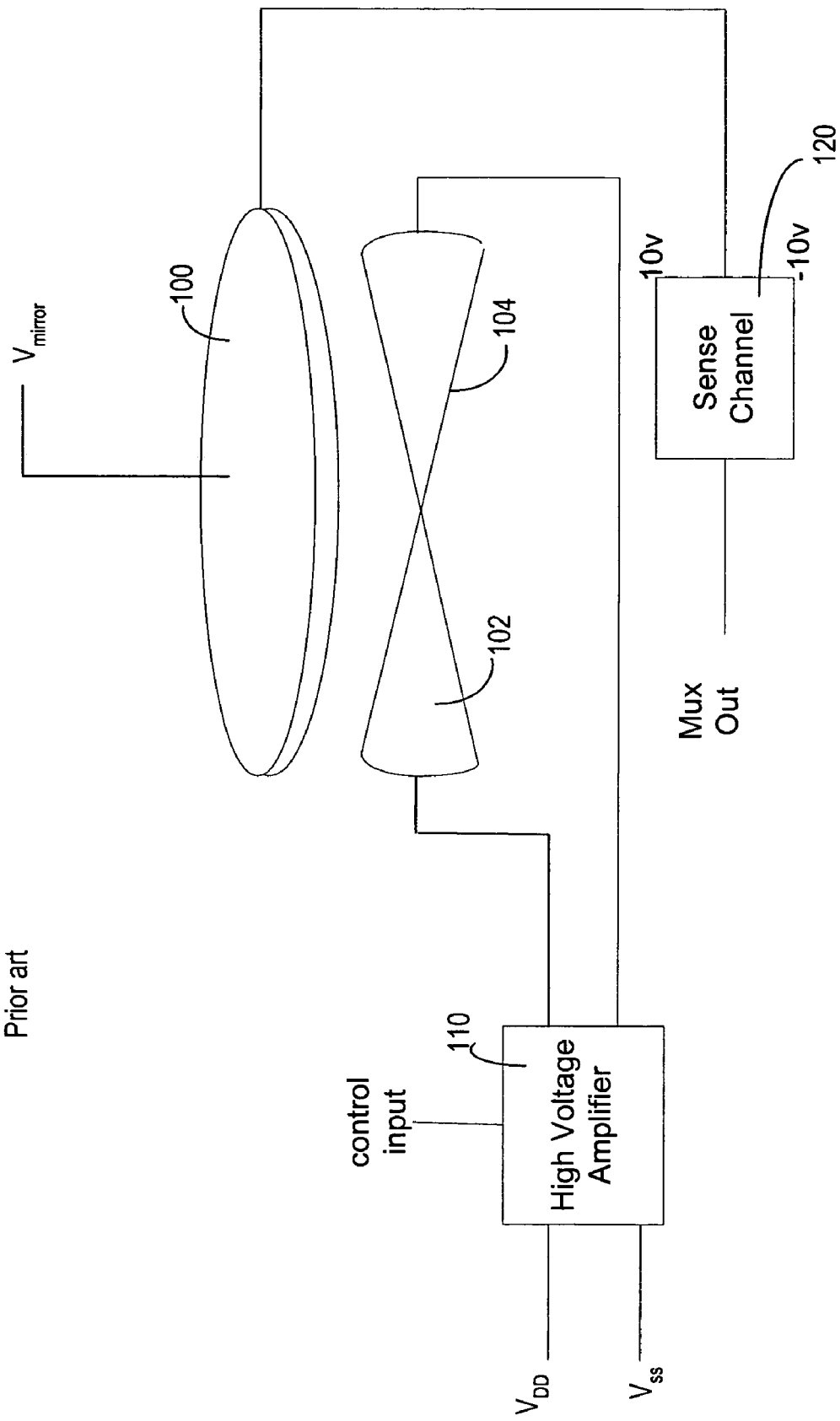
FIG. 1 is a diagram illustrating a conventional system used in the prior art for controlling the current applied to two control pads relative to a micromachined mirror.
Figure 2:
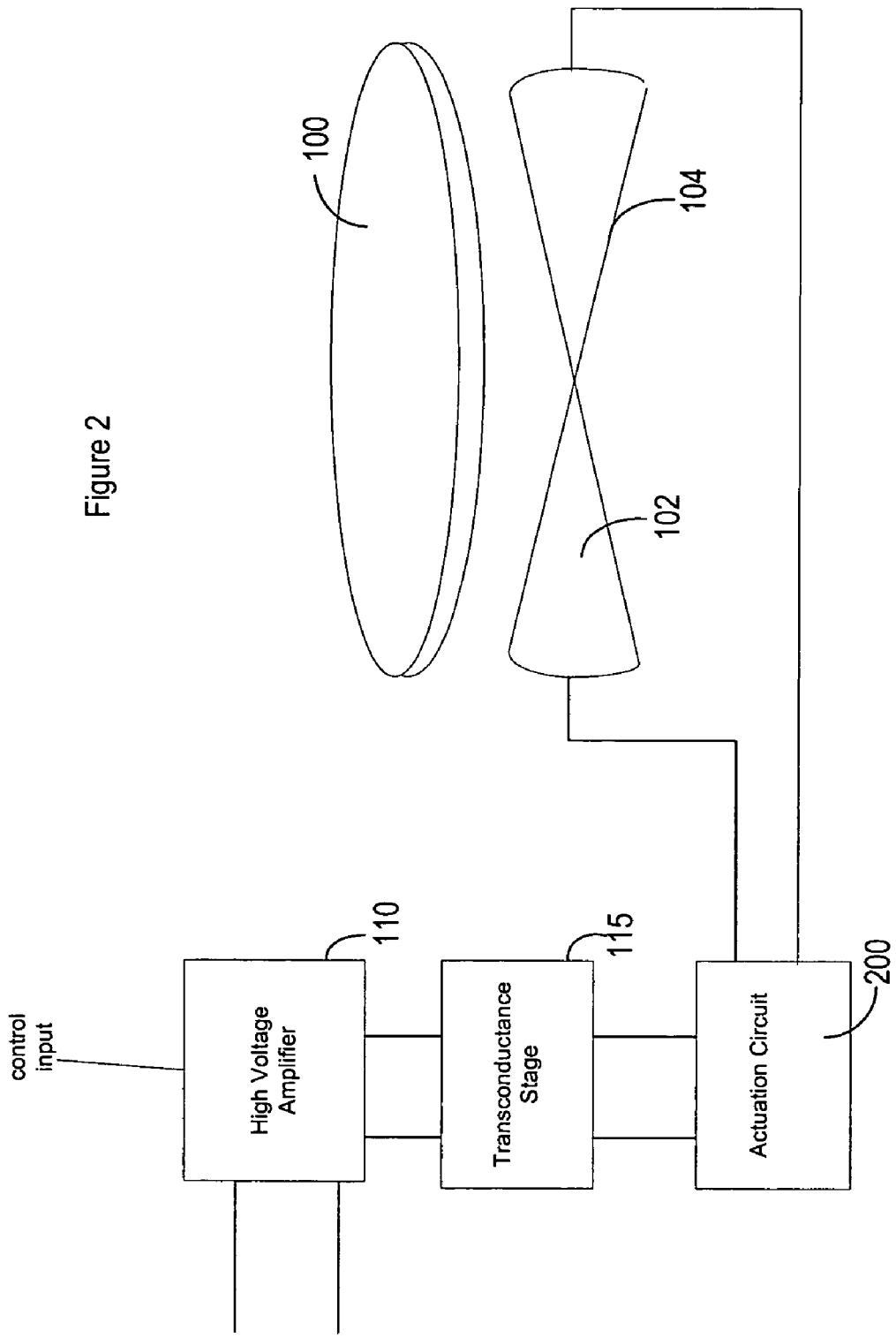
FIG. 2 is a diagram illustrating a system for controlling a micromachined mirror in accordance with the present invention.

FIG. 2 shows a system for controlling a force pad positioned adjacent to a MEMS mirror 100 in accordance with the present invention. As shown therein, a controller 109 having a control input may be coupled through a low voltage transconductance stage 115 to an actuation circuit 200. In this embodiment, and as described herein, the actuation circuit 200 is a high voltage output stage. In general, the actuation circuit takes the input currents generated by the low-voltage transconductance stage 115, detects the current state of it's own output electrodes (coupled to the force electrodes 102, 104 adjacent to the mirror), and steers the input current from the transconductance stage 115 to one of the two electrodes 102, 104. In effect, the invention provides an open loop transconductance stage and provides an integrator between the input voltage and the forcing voltage, allowing only one pad 102 or 104 to be active at one time. This is in stark contrast to prior art systems which do not attempt to integrate a control voltage to only a single pad.

Since only one of the force electrodes 102 or 104 is allowed to be active at one time, common mode runaway voltage is prevented.

Figure 3:
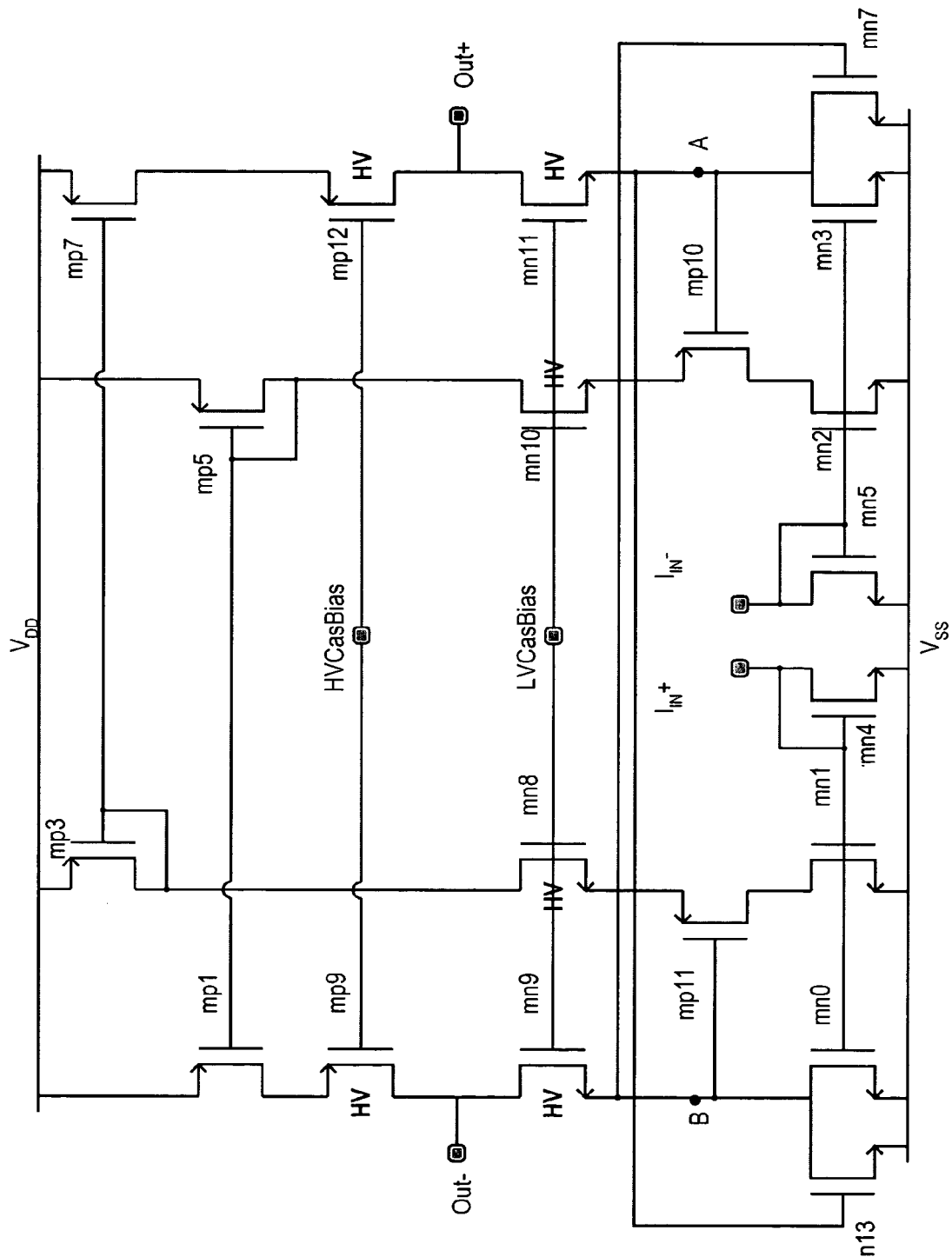
FIG. 3 is a schematic diagram illustrating a first embodiment of an actuation circuit formed in accordance with the present invention.

A schematic diagram of a first embodiment of the actuation circuit 200 of the present invention is shown in FIG. 3. In general, the currents generated at low voltages are steered to high voltage outputs of the actuation circuitry according to the state of those outputs. Shown in FIG. 3 are two current input terminals $I_{IN}-$ and $I_{IN}+$ and two output terminals OUT− and OUT+. In general, the input terminals would be coupled a low-voltage current-generation circuit such as a low voltage transconductance stage. In the circuit of FIG. 3, four operating voltages provided by on-chip or off-chip voltage sources are $V_{dd}$, $V_{ss}$, HVCasBias and LVCasBias. The circuit shown in FIG. 3 is generally symmetrical about the inputs and outputs. Each input $I_{IN}+$, $I_{IN}−$ is coupled to the drain of an NMOS transistor (mn4, mn5, for inputs $I_{IN}+$ and $I_{IN}−$, respectively), whose sources are coupled to the $V_{ss}$ rail. (By convention, a designation "mp" indicates a PMOS transistor while "mn" indicates an NMOS transistor. However, use of such designations should not be understood to indicate that the construction of the invention could not be performed using other transistor technologies, or complimentary transistors.) Currents input at each terminal are mirrored at NMOS transistors mn0, m1, mn2 and mn3. For each input, transistors mn0–mn4 may be sized to provide gain or may be the same size as input transistors mn4, mn5. In one embodiment, transistor mn0-mn4 are three times larger than mn4 and mn5. However, it should be recognized that this gain is not critical to the invention, and transistors mn0-mn4 may multiply the input current by 1 or any integer. In such embodiment, transistors mn9, mn8, mn10, and mn11 are high voltage DMOS transistors. Transistors mp9 and mp12 are high voltage pmos devices. All such transistors mn9, mp9, mn8, mn10, mp12 and mn11 may be of any high-voltage device construction.

Each output terminal is provided between a pair of complementary high voltage transistors. OUT− is coupled to the drains of NMOS mn9 and PMOS mp9, while OUT+ is coupled to the drains of NMOS mn11 and PMOS MP12. Current mirrors comprised of PMOS devices mp1 and mp5, and devices mp3 and mp7, respectively, are used in conjunction with high voltage transistors mn8 and mn10, and control (or "decision") transistors mp11 and mp10, to steer current to the outputs in accordance with the invention. While the invention is shown in FIG. 3 as comprised of metal gate oxide transistors, one of average skill in the art will readily recognize that the invention is not limited to the use of MOS technology but may readily be constructed with other types of transistors or switching devices.

Figure 4:
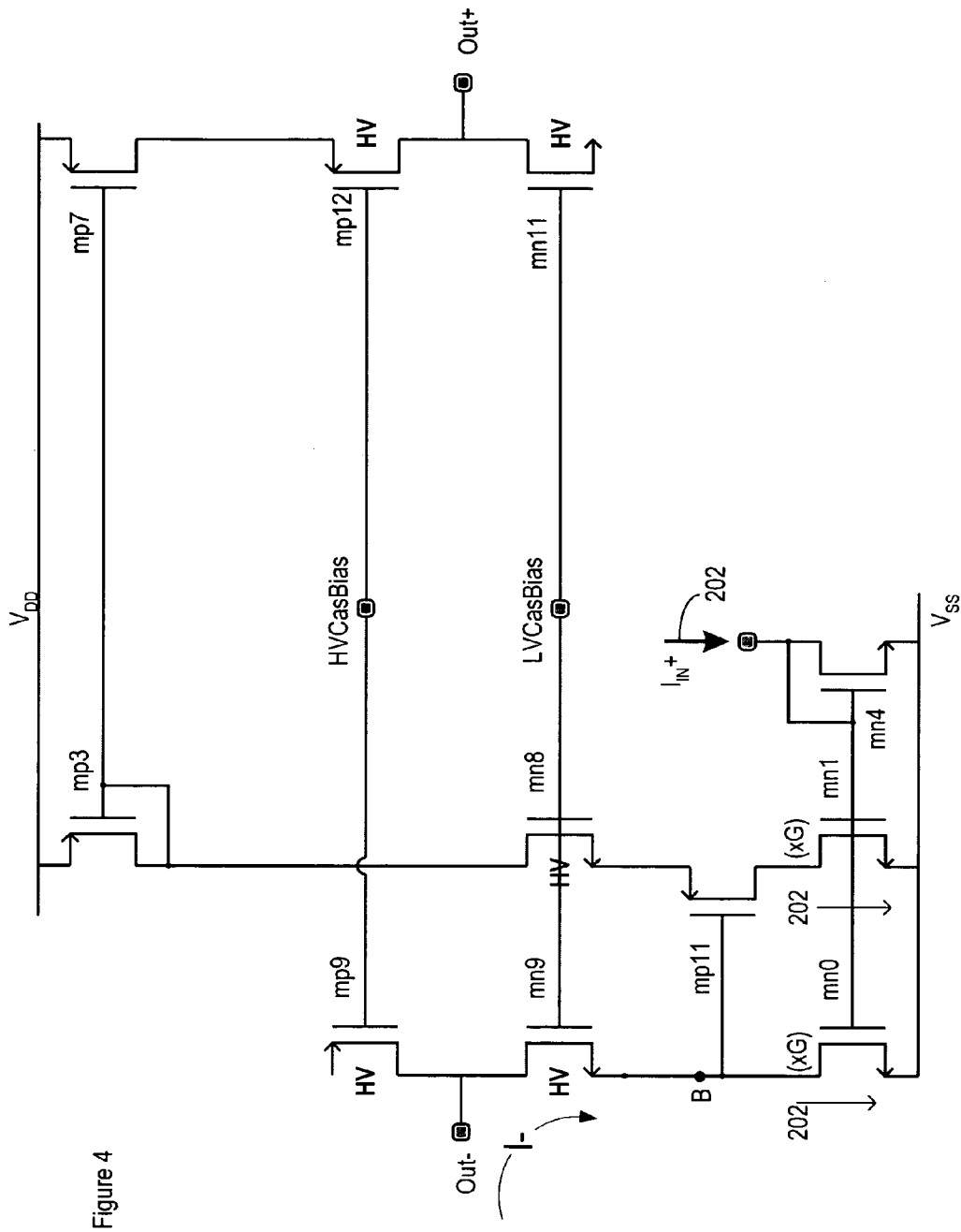
FIG. 4 is a schematic diagram illustrating a portion of the circuit of FIG. 3 in operation.
Figure 5:
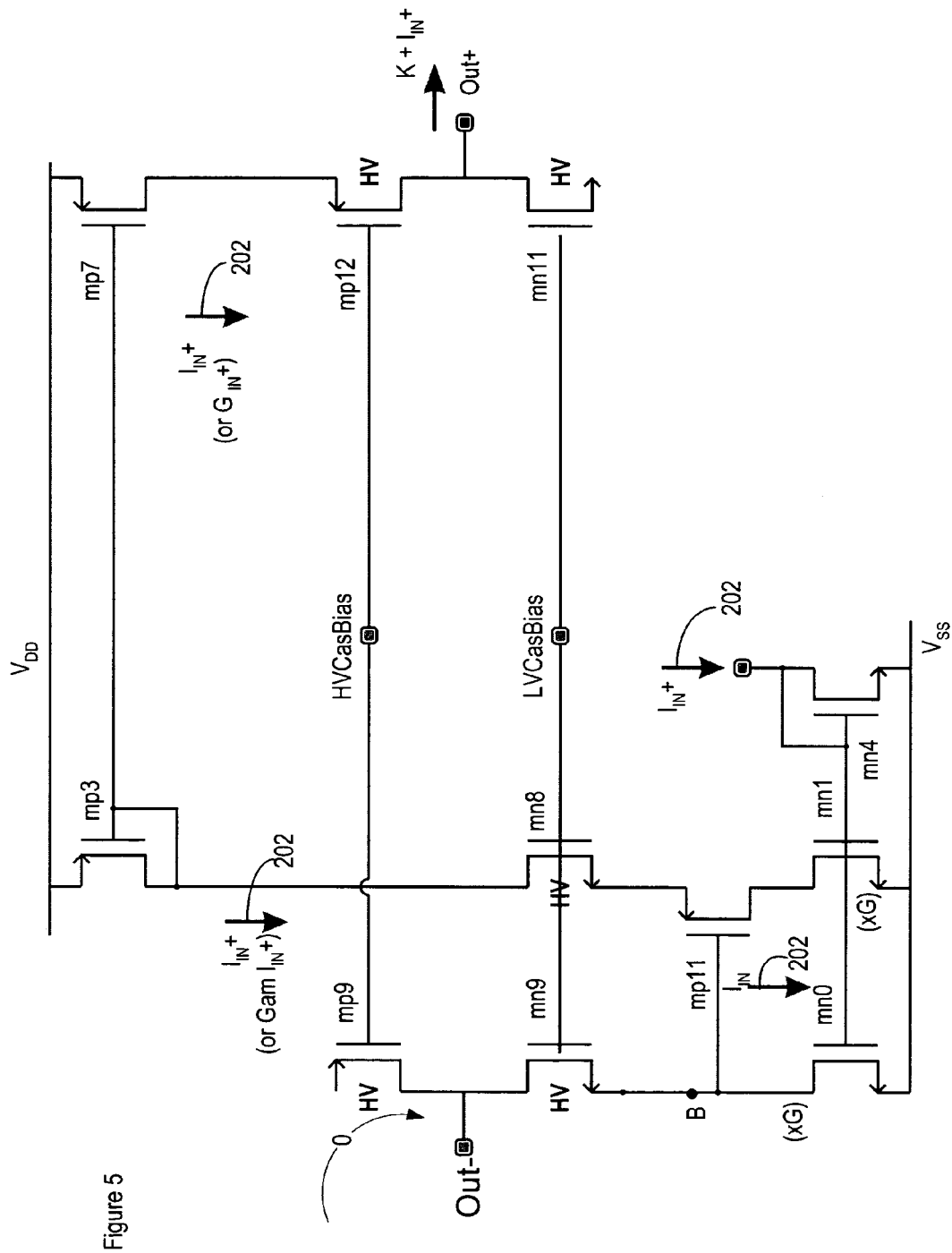
FIG. 5 is a schematic diagram illustrating a portion of the circuit of FIG. 3 in operation.

Operation of a single side of the circuit in FIG. 3 is illustrated in FIGS. 4 and 5. FIGS. 4 and 5 consider only the positive side of the circuit. Since the circuit of FIG. 3 is symmetrical, one will understand that the complimentary side of the circuit operates in a similar fashion. When an input current 202 is provided at $I_{IN}+$, the current is mirrored across transistors mn1 and mn0. (As noted above, in one embodiment, transistors mn0, mn1 may provide a gain of $I_{IN}$. For any size factor "G", gain will be increased by G.) Given that mn9 is an NMOS transistor and hence conducts from source to drain when biased with a gate voltage above a threshold, and its gate is coupled to a constant low voltage bias (LVCasBias), transistor mn0 will constantly sink current from mn9 away from OUT−. As discussed below, LVCasBias and HVCasBias must be held at an appropriate voltage in order for the outputs to conduct, and can be used as a control mechanism when shorted to the $V_{dd}$ and $V_{ss}$ rails. This will be true regardless of the output state of OUT−. If OUT− is not zero, then the source of mn9 (coupled to node B in FIG. 4) will be equivalent to LVCasBias less the threshold voltage $V_{TH}$ of mn9. The gate of transistor mp11, generally referred to herein as the "decision" transistor, will also be at a voltage of LVCasBias—V (mn9). Since mp11 is only "on" when its gate voltage is less than LVCasBias less the threshold voltages of mn8 and mp11, mp11 stays off until the voltage at OUT− approaches zero. As OUT− approaches zero, the source of mn9 drops and mp11 turns on.

As shown in FIG. 5, current then flows through mn8 to the cascode mirror comprising transistors mp3 and mp7, and to OUT+ through high voltage PMOS transistor mp12.

As such, the voltage at the source of the output DMOS transistor (in this case mn9) is used to make the decision on where input current from the input terminal is directed. (This decision is either to sink the output of OUT− or to OUT+.)

In a further aspect of the invention, an automatic output pull-down feature is enabled by transistors mn7 and mn12. Devices mn7 and mn12 hold the inactive output node low once the opposing pad has a non-zero output voltage. In the example shown in FIGS. 4 and 5, if the gate of mn7 is "high" (coupled to node B), it must be because the OUT− pad is also high, and mn7 is on with OUT+ being held low. Likewise, if the gate of mn12 coupled to Node A is high, this must be due to the fact that the OUT+ pad is also high and mn7 will sink current from OUT− until OUT+ drops. In this manner, nodes A and B control both the steering device and whether the output node is held low. This prevents charge buildup on the inactive pad.

Figure 6:
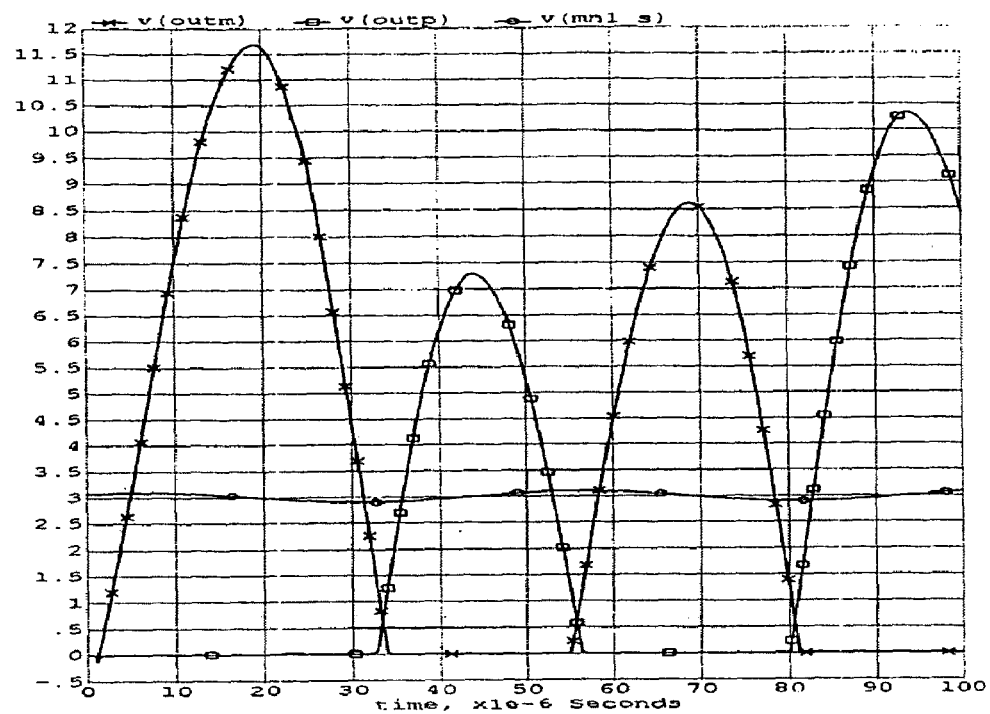
FIG. 6 is a graph showing the transient response of the circuit.

FIG. 6 shows the transient response of the circuit, demonstrating the output behavior of the circuit. FIG. 6 is a simulation of the output response with the output devices constantly enabled and a sinusoidal input (denoted V(mn1-s)) in the graph. In this simulation, an input voltage above 3V provides the output driver with a positive input current, and a voltage below 3V provides a negative input current. Both the pseudo-differential and integrating natures of the output circuit are shown. Note that as one output signal reaches zero, the other begins to rise.

Figure 7:
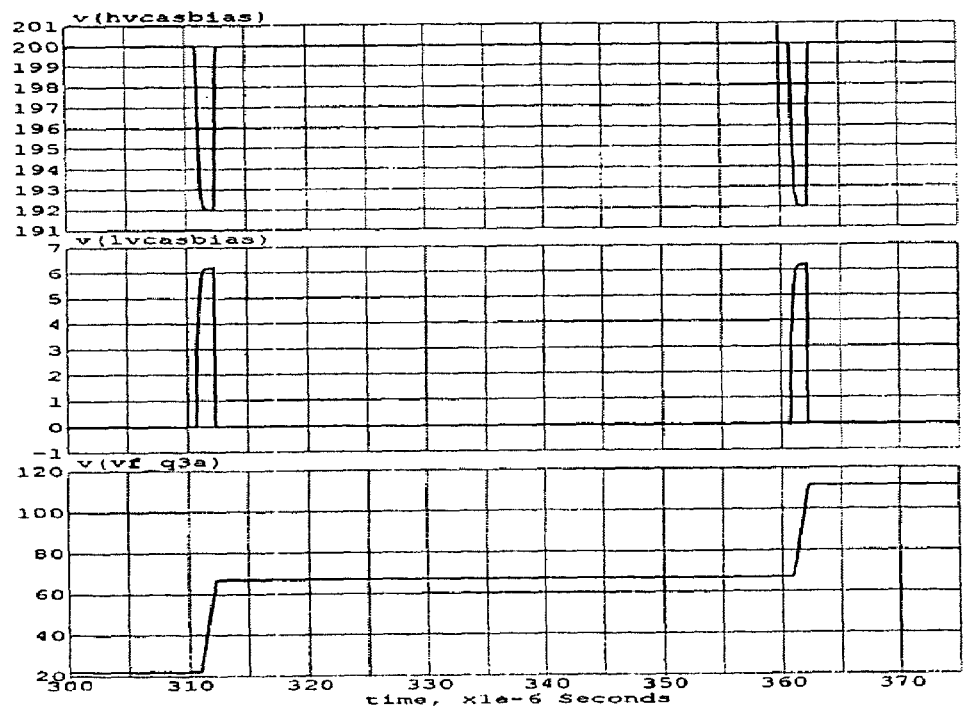
FIG. 7 is a graph showing the output transient with a constant input and output device switching.

FIG. 7 shows the behavior of the driver with a constant input and the cascode bias nodes switching. It can be seen that the voltage changes only when the cascode biases are pulled away from their rails. When the bias nodes are shorted to the rails, the output voltage is unchanging.

A further advantage of the actuation circuit of the present invention is that ability to completely turn off the output devices in order to save power. Since nodes HVCasBias and LVAasBias control the output devices, holding the nodes at an appropriate voltage with respect to the associated $V_{dd}$ and $V_{ss}$ rail, the outputs conduct; if, however, the bias voltages are shorted to the rails, the output devices will shut off.

This provides a further advantage in that the voltage at the output can be sampled (e.g. held constant with respect to the shorted voltages) by shorting the Bias voltages. This provides a power savings and allows adaptation of the circuit to sampled data systems.

Numerous modifications to the actuation circuit of the present invention are possible. For example, as an alternative to the single PMOS mirrors shown herein, cascoded or feedback PMOS current mirrors could be used for enhanced accuracy.

In another alternative embodiment, disable transistors may be coupled in parallel with transistors mn7 and mn13. In this embodiment, the disable transistors could comprise, for example, NMOS transistors having a source coupled to the $V_{ss}$ rail, and a drain coupled in common with the drain of the mn13/mn0 or mn7/mn3 drain, and a gate coupled to an input terminal to which a disable signal could be used to short the respective output terminal. This would allow one to short both outputs to the vss rail, regardless of the current output state of the circuit. In essence, such a configuration provides a manual override with the same functionality as that automated by mn7 and mn13.

In yet another alternative embodiment, transistors mn7 and mn13 may be eliminated if, for example, the system providing input current to the inputs and any additional circuitry coupled to OUT+ and OUT− is designed properly. A design in accordance with this embodiment would require that any leakage current which would exist in the current in the absence of any current input would not result in a differential voltage at OUT+ and OUT−, thereby bringing about the common node problem. Some compensation to ensure that the "off" node output is cleared of any leakage current should exist.

Figure 8:
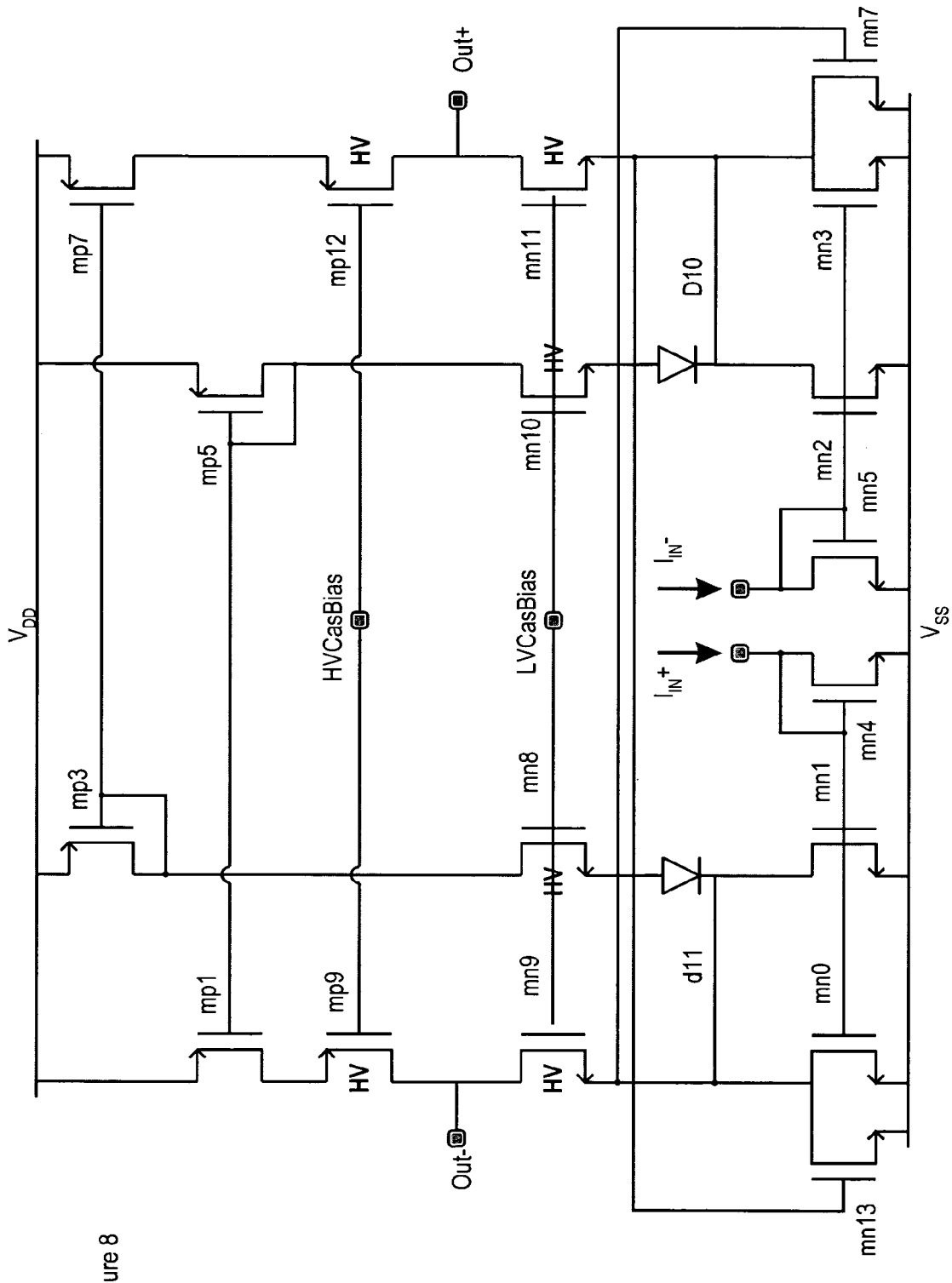
FIG. 8 is a schematic diagram illustrating a second embodiment of the present invention.

FIG. 8 shows a yet another variation of the invention wherein diodes replace the decision transistors. In using this embodiment, one is required to ensure that the second node (inactive) is retained in pull down mode by some means (a separate pull down transistor or an external mechanism), since there is no inherent control in the actuation circuit shown in FIG. 8 to accomplish this purpose. However, it provides a simpler construction than other embodiments shown herein.

It should be further recognized that two actuation circuits may be utilized in accordance with the present invention to provide a four pad, three dimensional embodiment for controlling the mirror.

Figure 9:
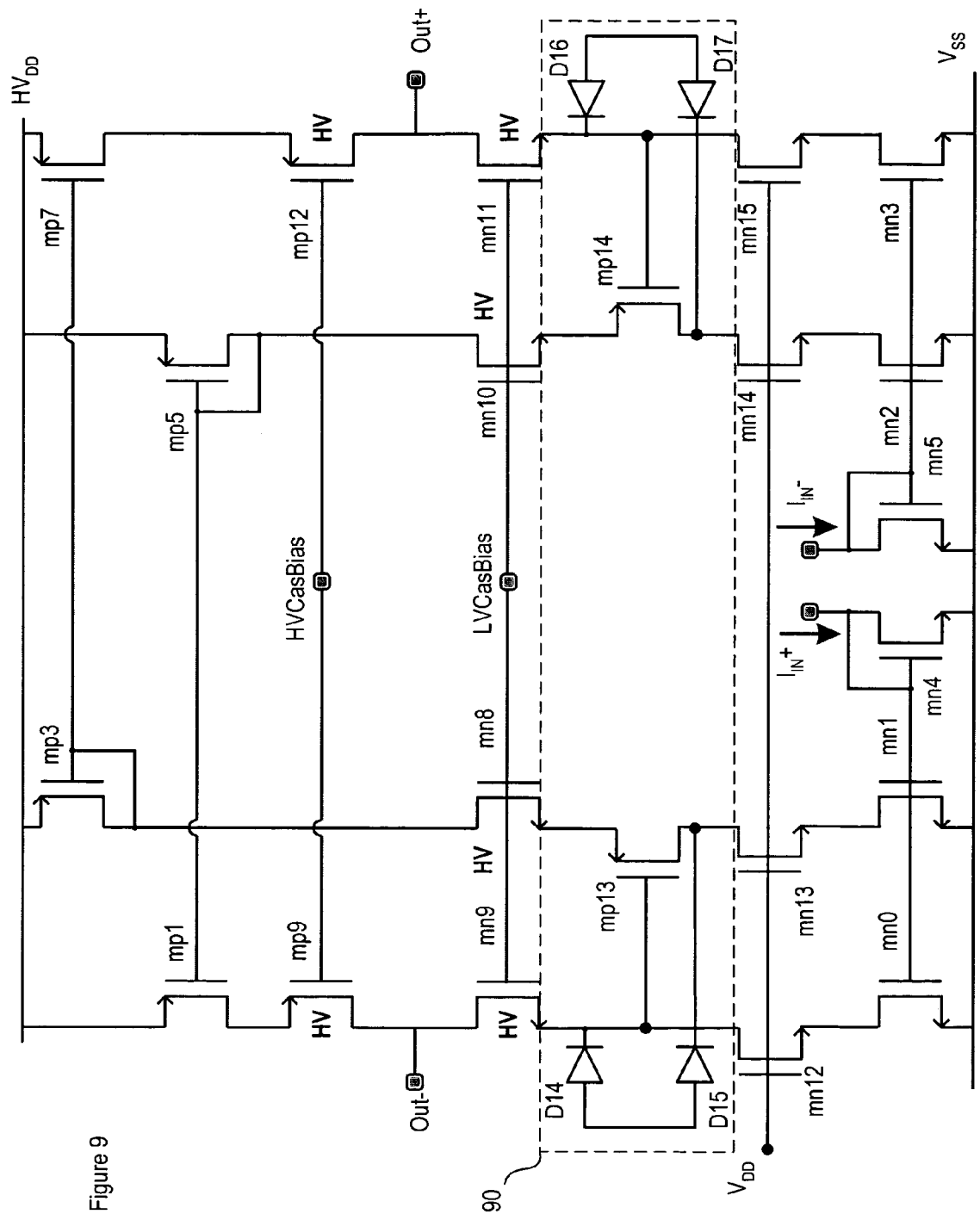
FIG. 9 is a schematic diagram illustrating a third embodiment of the present invention.

FIG. 9 shows yet another alternative embodiment of the present invention. In this embodiment, a third intermediate voltage is used. A high voltage rail $HV_{DD}$ which is greater than the intermediate voltage ($MV_{DD}$) and $V_{DD}$. In this embodiment, an intermediate stage 90 is comprised of decision transistors MP13 and MP14, and diodes D14–D16. The lowest NMOS transistors MN0–mn5 are identical to those in FIG. 8. However, the current from these transistors is run up through low voltage NMOS cascodes mn12–mn15 into the intermediate stage 90, and to decision transistors m13 and mp14. In this embodiment, the "bottom rail" for the output is now raised to $V_{dd}$, which may be any voltage greater than zero.

The circuit of the present invention provides a power and space savings over alternative solutions for controlling the force pads of individual mirrors in a mirror array. For example, were one to use a resistive feedback array, any use or reasonably sized resistors would draw an un acceptable amount of power due to the high voltages typically in use. Conversely if the power draw is kept to a minimum, the size of the resistor would preclude its use as an integrated (on-chip) solution. The same would be true with a high voltage switching scheme.

The present invention provides a solution to the problem of determining mirror position using an open loop (no-feedback) transconductance stage. Because of its integrating nature, one may wish to include it in a larger feedback loop to ensure stability.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An actuation circuit having at least a first output and a second output, and a first input, comprising:
    a current sink coupled to the first output, the current sink enabled when a current is applied to said first input; and
    a decision switch coupled to the current sink and enabling a current path from the first input to the second output only when a voltage present at said first output reaches a threshold, wherein the decision switch is a diode.

2. The actuation circuit of claim 1 wherein the first output is coupled to a first force pad and the second output is coupled to a second force pad.

3. The actuation circuit of claim 1 farther including a second current sink enabled responsive to a voltage at the second output.

4. The actuation circuit of claim 1 farther including a manual reset transistor.

5. The actuation circuit of claim 1 wherein each of said first and second output is coupled to a drain of a high voltage PMOS transistor and a drain of a high voltage NMOS transistor.

6. The actuation circuit of claim 1 further including a gain element coupled in series with the decision switch.

7. An actuation circuit having at least a first output and a second output, and a first input, comprising:
    a current sink coupled to the first output, the current sink enabled when a current is applied to said first input; and
    a decision switch coupled to the current sink and enabling a current path from the first input to the second output only when a voltage present at said first output reaches a threshold, wherein the decision switch is a transistor coupled between a current mirror and the input.

8. The actuation circuit of claim 7 wherein the current mirror is a PMOS current mirror.

9. The actuation circuit of claim 7 wherein the current mirror is a cascaded current mirror.

10. An apparatus comprising a micromechanical mirror structure positioned adjacent to a first and a second force pads, and a control circuit having a first output coupled to the first control pad and a second output coupled to the second control pad, the control circuit, comprising:
    an input having a current coupled thereto;
    a decision transistor coupled to the first output and enabling a current path to the second output; and
    a current sink coupled to the first output, wherein the current sink comprises a first transistor having a gate coupled to said input, and a second transistor having a gate coupled to said second output.

11. The apparatus of claim 10 wherein said current sink is enabled by said current at said input.

12. The apparatus of claim 10 wherein said current sink is enabled by a voltage at the second output.

13. The apparatus of claim 10 wherein the current path is between a first voltage greater than zero and a second voltage greater than zero.

14. An apparatus comprising a micromechanical mirror structure positioned adjacent to a first and a second force pads, and a control circuit having a first output coupled to the first control pad and a second output coupled to the second control pad, the control circuit, comprising:
    an input having a current coupled thereto;
    a decision transistor coupled to the first output and enabling a current path to the second output;
    a current sink coupled to the first output; and
    a high voltage amplifier coupled to a transconductance stage, the transconductance stage having an output coupled to said input of said control circuit.

15. An apparatus comprising a micromechanical mirror structure positioned adjacent to a first and a second force pads, and a control circuit having a first output coupled to the first control pad and a second output coupled to the second control pad, the control circuit, comprising:
    an input having a current coupled thereto;
    a second input;
    a decision transistor coupled to the first output and enabling a current path to the second output;
    a second decision transistor coupled to the second output and enabling a current path to the first output;
    a current sink coupled to the first output; and
    a second current sink coupled to the second output.

16. A method of operating a micromachined mirror having at least a first force pad coupled to a first control output and a second force pad coupled to a second control output, both force pads provided adjacent to the mirror, comprising:
    receiving a control current designated for said first output;
    detecting whether an output voltage is present at said second output;
    sinking current second output to ground; and
    steering the control current provided to said first output when said output voltage is below a threshold.

17. The method of claim 16 wherein said step of detecting comprises coupling a gate of a decision transistor to a conduction path of said fist output.

18. The method of claim 17 wherein said step of steering comprises activating said transistor when said output voltage reflected at said first output reaches said threshold.

19. The method of claim 16 wherein said step of sinking comprises sinking current responsive to said control current.

20. The method of claim 16 wherein said step of sinking comprises sinking current responsive to an output voltage present at said first output.

21. The method of claim 16 wherein said method further includes the step of clearing the voltage from said first output prior to said step of receiving.

22. An actuation circuit, comprising:
 a first input and a second input;
 a first output and a second output;
 a first current sink coupled to the first output and enabled by a signal at said first input;
 a second current sink coupled to the second output and enabled by a signal at said second input;
 a first current steering switch enabled by said first output;
 a second current steering switch enabled by said second output;
 a first high voltage cascode mirror coupled to said first current steering switch; and
 a second cascode mirror coupled to said second current steering switch.

23. The actuation circuit of claim 22 wherein each said output is provided at the drain electrodes of a drain coupled pair of an NMOS high voltage transistor and a PMOS high voltage transistor.

24. The actuation circuit of claim 22 wherein each cascode mirror includes at least an NMOS transistor actuated to a bias voltage.

25. The actuation circuit of claim 22 wherein each said current steering switch is a transistor.

26. The actuation circuit of claim 25 wherein said current steering transistor is a PMOS transistor.

27. A steerable micromachined mirror assembly, comprising:
 a micromachined mirror positioned adjacent to at least a first force pad and a second force pad;
 a high voltage amplifier;
 a low voltage transconductance stage; and
 a control circuit coupled to said first force pad and said second force pad, the control circuit including:
 a current sink coupled to the first force pad, the current sink enabled when a current from said transconductance stage is received; and
 a decision switch coupled to the current sink and enabling a current path from the transconductance stage to the second output when a voltage present at said first output reaches a predetermined minimum level.

* * * * *